United States Patent
Klausner et al.

(10) Patent No.: US 9,776,154 B2
(45) Date of Patent: Oct. 3, 2017

(54) MATERIAL COMPRISING TWO DIFFERENT NON-METALLIC PARRTICLES HAVING DIFFERENT PARTICLE SIZES FOR USE IN SOLAR REACTOR

(71) Applicant: University of Florida Research Foundation, Inc., Gainesville, FL (US)

(72) Inventors: James F. Klausner, Gainesville, FL (US); Ayyoub Mehdizadeh Momen, Gainesville, FL (US); Fotouh A. Al-Raqom, Gainesville, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 113 days.

(21) Appl. No.: 14/653,427

(22) PCT Filed: Dec. 18, 2013

(86) PCT No.: PCT/US2013/076037
§ 371 (c)(1),
(2) Date: Jun. 18, 2015

(87) PCT Pub. No.: WO2014/100134
PCT Pub. Date: Jun. 26, 2014

(65) Prior Publication Data
US 2015/0321158 A1   Nov. 12, 2015

Related U.S. Application Data

(60) Provisional application No. 61/745,042, filed on Dec. 21, 2012.

(51) Int. Cl.
*B32B 5/16* (2006.01)
*C09C 1/00* (2006.01)
(Continued)

(52) U.S. Cl.
CPC . *B01J 8/02* (2013.01); *B01J 8/18* (2013.01); *B01J 19/08* (2013.01); *B07B 15/00* (2013.01);
(Continued)

(58) Field of Classification Search
CPC ... C09C 1/0081; C04B 14/308; C04B 14/306; C04B 14/32; C04B 2235/604
(Continued)

(56) References Cited

U.S. PATENT DOCUMENTS

| 4,030,890 A | 6/1977 | Diggs |
| 4,115,927 A | 9/1978 | Rosensweig |

(Continued)

FOREIGN PATENT DOCUMENTS

| DE | 2735767 A1 | 3/1979 |
| JP | H10279955 A | 10/1998 |

(Continued)

OTHER PUBLICATIONS

Coker et al, Ferrite-YSZ composites for solar thermochemical production of synthetic fuels: in operando characterization of CO2 reduction, J. Mater. Chem., 2011, 21, 10767.*

(Continued)

*Primary Examiner* — Holly Le
(74) *Attorney, Agent, or Firm* — Cantor Colburn LLP (57) ABSTRACT

Disclosed herein is a composite particle comprising a first non-metallic particle in which is dispersed a second non-metallic particle, where the first non-metallic particle and the second non-metallic particle are inorganic; and where a chemical composition of the first non-metallic particle is different from a chemical composition of the second non-metallic particle; and where the first non-metallic particle and the second non-metallic particle are metal oxides, metal carbides, metal nitrides, metal borides, metal silicides, metal (Continued)

oxycarbides, metal oxynitrides, metal boronitrides, metal carbonitrides, metal borocarbides, or a combination thereof.

12 Claims, 7 Drawing Sheets

(51) Int. Cl.
| | |
|---|---|
| B01J 8/02 | (2006.01) |
| H01F 1/01 | (2006.01) |
| B07B 15/00 | (2006.01) |
| C01B 3/02 | (2006.01) |
| C01B 31/18 | (2006.01) |
| B01J 19/08 | (2006.01) |
| B01J 8/18 | (2006.01) |
| C01G 25/02 | (2006.01) |
| C01G 49/08 | (2006.01) |
| C01G 49/04 | (2006.01) |
| H01L 31/00 | (2006.01) |

(52) U.S. Cl.
CPC ............... *C01B 3/02* (2013.01); *C01B 31/18* (2013.01); *C01G 25/02* (2013.01); *C01G 49/04* (2013.01); *C01G 49/08* (2013.01); *C09C 1/0081* (2013.01); *H01F 1/01* (2013.01); *H01L 31/00* (2013.01); *B01J 2208/00805* (2013.01); *B01J 2208/024* (2013.01); *Y10T 428/2982* (2015.01)

(58) Field of Classification Search
USPC .............. 428/402–406; 501/96.1, 103, 126
See application file for complete search history.

(56) References Cited

U.S. PATENT DOCUMENTS

| | | | |
|---|---|---|---|
| 4,292,171 | A | 9/1981 | Mayer et al. |
| 4,319,893 | A | 3/1982 | Hatch et al. |
| 4,430,254 | A | 2/1984 | Passariello |
| 5,143,668 | A | 9/1992 | Hida |
| 5,863,850 | A | 1/1999 | Nawa |
| 6,633,042 | B1 | 10/2003 | Funken et al. |
| 6,780,457 | B2 | 8/2004 | Baumann et al. |
| 7,033,570 | B2 | 4/2006 | Weimer et al. |
| 7,140,181 | B1 | 11/2006 | Jensen et al. |
| 8,110,174 | B2 | 2/2012 | Kodama |
| 8,187,731 | B2 | 5/2012 | Weimer |
| 8,388,706 | B2 | 3/2013 | Ugolin |
| 2003/0208959 | A1 | 11/2003 | Weimer et al. |
| 2005/0175533 | A1 | 8/2005 | Thomas et al. |
| 2006/0229476 | A1 | 10/2006 | Mitchell et al. |
| 2008/0089834 | A1 | 4/2008 | Kodama |
| 2008/0236389 | A1 | 10/2008 | Leedy et al. |
| 2009/0142578 | A1 | 6/2009 | Riman et al. |
| 2009/0232725 | A1 | 9/2009 | Aaron |
| 2010/0140154 | A1 | 6/2010 | Colon et al. |
| 2010/0303692 | A1 | 12/2010 | Perkins et al. |
| 2011/0048690 | A1 | 3/2011 | Reppel et al. |
| 2011/0136027 | A1 | 6/2011 | Chen et al. |
| 2012/0295113 | A1 | 11/2012 | Kurizoe |
| 2012/0302436 | A1 | 11/2012 | Vormberg |
| 2014/0291570 | A1 | 10/2014 | Klausner |
| 2014/0346034 | A1 | 11/2014 | Klausner |

FOREIGN PATENT DOCUMENTS

| | | |
|---|---|---|
| KR | 20110037329 A | 4/2011 |
| KR | 20110077154 A | 7/2011 |
| WO | WO9600125 A1 | 1/1996 |
| WO | WO03004942 A1 | 1/2003 |
| WO | WO03076334 A1 | 9/2003 |
| WO | WO2010041014 A1 | 4/2010 |

OTHER PUBLICATIONS

European Extended Search Report for EP Application No. 12859196.3; Issued Dec. 1, 2015 (6 pages).
Diver et al.; "Testing of a CR5 Solar Thermochemical Heat Engine Prototype", Proceedings of the ASME 2010 4th International Conference on Energy Sustainability, May 2010, pp. 1-8
European Extended Search Report for EP Application No. 13865853.9; Issued Aug. 19, 2016 (5 pages).
Kodama et al.; "A Two-Step Thermochemical Water Splitting by Iron-Oxide on Stabilized Zirconia", Journal of Solar Energy Engineering, vol. 128, No. 1, Jan. 2006, 5 pages.
Abanades, Stéphane et al., "$CO_2$ splitting by thermo-chemical looping based on $Zr_xCe_{1-x}O_2$ oxygen carriers for synthetic fuel generation" Fuel, vol. 102, Dec. 2012, pp. 180-186, Special Section: ACS Clean Coal.
DE2735767 Published Mar. 1, 1979; Machine Translation; 19 Pages.
Diver, Richard B. et al., "Solar Thermochemical Water-Splitting Ferrite-Cycle Heat Engines", J. Sol. Energy Eng., Nov. 2008, vol. 130, Issue 4, 041001 (8 pages).
Evans, Lindsey R. et al., "Materials Development for the CR5 Solar Thermochemical Heat Engine", ASME 2006 International Solar Energy Conference (ISEC2006), Jul. 8-13, 2006 , Denver, Colorado, USA Sponsor: Solar Energy Division, Solar Energy, Paper No. IS.
Extended European Search Report for EP Application No. 12811990.6; Report mail date 02.02.2015 (6 pages).
Gokon, Nobuyuki et al., "Ferrite/zirconia-coated foam device prepared by spin coating for solar demonstration of thermochemical water-splitting", International Journal of Hydrogen Energy, vol. 36, Issue 3, Feb. 2011, pp. 2014-2028.
Gokon, Nobuyuki et al., "Monoclinic zirconia-supported $Fe_3O_4$ for the two-step water-splitting thermochemical cycle at high thermal reduction temperatures of 1400-1600° C.", International Journal of Hydrogen Energy, vol. 34, Issue 3, Feb. 2009, Pages.
Gokon, Nobuyuki et al., "Thermochemical two-step water-splitting for hydrogen production using Fe—YSZ a particles and ceramic foam device", Energy, vol. 33, Issue 9, Sep. 2008, pp. 1407-1416.
Guillot, Stéphanie, et al. "Corrosion effects between molten salts and thermal storage material for concentrated solar power plants", Applied Energy, vol. 94, Jun. 2012, pp. 174-181.
Herrmann, Ulf, et al. "Two-tank molten salt storage for parabolic trough solar power plants", Energy, vol. 29, Issues 5-6, Apr.-May 2004, pp. 883-893.
International Preliminary Report on Patentability for Application No. PCT/US2012/045698 filed Jul. 6, 2012; Issued Jan. 23, 2014; 7 pages.
International Preliminary Report on Patentability for Application No. PCT/US2012/071332 filed Dec. 21, 2012; Issued. Jun. 24, 2014; 7 pages.
International Preliminary Report on Patentability for International Application No. PCT/US2013/076037 International Filing date Dec. 18, 2013; Report Mail Date Jun. 23, 2015; 7 pages.
International Search Report for Application No. PCT/US2012/045698 filed Jul. 6, 2012; Issued Jan. 21, 2013; 5 pages.
International Search Report for Application No. PCT/US2012/071332 filed Dec. 21, 2012; Issued Apr. 29, 2013; 5 pages.
International Search Report for International Application No. PCT/US2013/076037 International Filing date Dec. 18, 2013; Report Mail Date Apr. 4, 2014; 5 pages.
Kodama, T. et al. "Thermochemical hydrogen production by a redox system of $ZrO_2$-supported Co(II)-ferrite", Solar Energy, vol. 78, Issue 5, May 2005, Solar Hydrogen pp. 623-631.
Lichty , Paul et al., "Atomic layer deposited thin film metal oxides for fuel production in a solar cavity reactor", International Journal of Hydrogen Energy, vol. 37, Issue 22, Nov. 2012, pp. 16888-16894.
Mehdizadeh, Ayyoub M., "Enhancement of thermochemical hydrogen production using an iron—silica magnetically stabilized porous structure", International Journal of Hydrogen Energy, vol. 37, Issue 11, Jun. 2012, pp. 8954-8963.
Meier, Anton et al., "Solar chemical reactor technology for industrial production of lime" Solar Energy 80 (2006) 1355-1362.

(56) References Cited

OTHER PUBLICATIONS

Roeb, Martin, et al. "Materials-Related Aspects of Thermochemical Water and Carbon Dioxide Splitting: A Review" Materials 2012, 5(11), 2015-2054; Published: Oct. 24, 2012.
Wieckert, C. "Design Studies for a Solar Reactor Based on a Simple Radiative Heat Exchange Model" Journal of Solar Energy Engineering, Aug. 2005, vol. 127; pp. 425-429.
Written Opinion for Application No. PCT/US2012/045698 filed Jul. 6, 2012; Issued Jan. 21, 2013; 5 pages.
Written Opinion for Application No. PCT/US2012/071332 filed Dec. 21, 2012; Issued Apr. 29, 2013; 6 pages.
Written Opinion for International Application No. PCT/US2013/076037 International Filing date Dec. 18, 2013; Report Mail Date Apr. 4, 2014; 5 pages.
Yang, Zhen, et al. "Thermal analysis of solar thermal energy storage in a molten-salt thermocline", Solar Energy, vol. 84, Issue 6, Jun. 2010, pp. 974-985.
Zhu, Xing, et al. "Hydrogen and syngas production from two-step steam reforming of methane over $CeO_2$—$Fe_2O_3$ oxygen carrier", Journal of Rare Earths, vol. 28, Issue 6, Dec. 2010, pp. 907-913.

\* cited by examiner

FIG. 1

Sintering (Prior Art)

MATERIAL COMPRISING TWO DIFFERENT NON-METALLIC PARRTICLES HAVING DIFFERENT PARTICLE SIZES FOR USE IN SOLAR REACTOR

CROSS REFERENCE TO RELATED APPLICATIONS

This application claims the benefit of International Application No. PCT/US13/076037, filed on Dec. 18, 2013, which claims the benefit of U.S. application Ser. No. 61/745,042, filed on Dec. 21, 2012, which is incorporated herein by reference in their entirety.

STATEMENT REGARDING FEDERALLY SPONSORED RESEARCH

This invention was made with government support under Contract Number DE-AR-0000184 awarded by U.S. Department of Energy/Advanced Research Projects Agency-Energy (DOE/ARPA-E). The government has certain rights in the invention.

BACKGROUND

This disclosure relates the novel materials for use in a solar reactor. In particular, this disclosure relates to materials that are used in reactor beds (fluidized and stabilized) and in beds employed in solar reactors.

Figure 1:
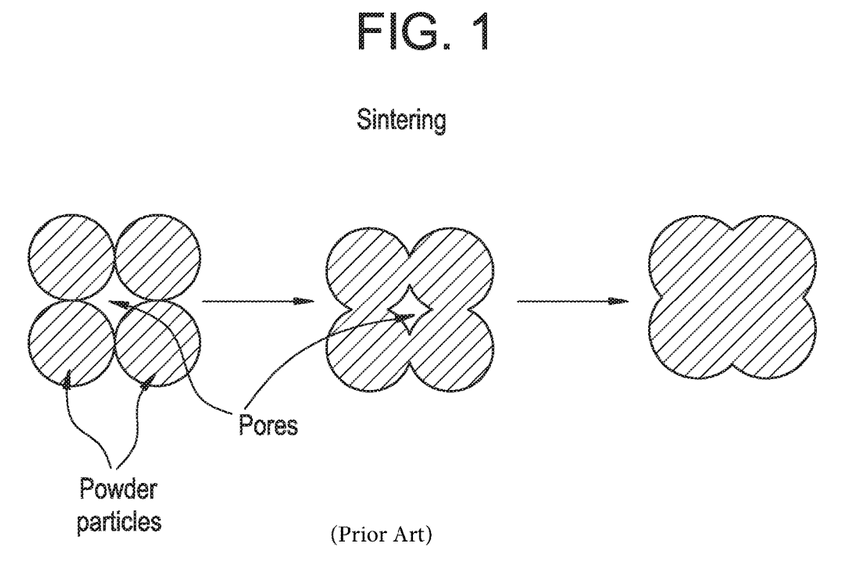
FIG. 1 is a depiction of the fusing of particles that generally occurs in conventional fluid bed reactors.

Fluidized and stabilized beds (hereinafter beds) comprising magnetic particles are often used to drive high temperature chemical reactions. In order to produce a bed that contains magnetic particles, the magnetic particles are disposed upon a substrate and then sintered together. During the sintering process however, the particles that form the substrate fuse together to produce a clump of a metal oxide that has a very low surface area and that can no longer be fluidized. The FIG. 1 illustrates the results of a sintering process (i.e., a prior art process). In the FIG. 1, it can be seen that powder particles that have magnetic particles disposed thereon are sintered and fuse together to form a clump of a metal oxide that has a very low surface area. This low surface area clump of metal oxide is unsuitable for supporting chemical reactions.

It is therefore desirable to develop methods for manufacturing beds that have a high porosity and surface area, and that can function in a manner similar to other commercially available reactor beds without undergoing sintering and a reduction in surface area as a result of undesirable sintering.

SUMMARY

Disclosed herein is a composite particle comprising a first non-metallic particle in which is dispersed a second non-metallic particle, where the first non-metallic particle and the second non-metallic particle are inorganic; and where a chemical composition of the first non-metallic particle is different from a chemical composition of the second non-metallic particle; and where the first non-metallic particle and the second non-metallic particle are metal oxides, metal carbides, metal nitrides, metal borides, metal silicides, metal oxycarbides, metal oxynitrides, metal boronitrides, metal carbonitrides, metal borocarbides, ceramics or a combination thereof.

Disclosed herein too is a method comprising mixing a first non-metallic particle with a second non-metallic particle to produce a homogeneous mixture; sintering the homogenous mixture to a temperature that is within ±150° C. of the melting point of the lower melting component of the first non-metallic particle with a second non-metallic particle; where the sintering produces a sintered composite; and crushing the sintered composite to form particulates.

DETAILED DESCRIPTION

Metals at very high temperatures can react with steam, $H_2O$ (or carbon dioxide, $CO_2$) and form metal oxides and crack the water (or carbon dioxide) molecules and produce hydrogen (or carbon monoxide). At elevated temperatures as high as 1450° C. and under a vacuum environment the metal oxides can be thermally reduced. This process is known as thermochemical looping. However, the development of an efficient and commercially viable thermochemical looping reactor has not yet been achieved, largely due to the sintering of monolithic metallic structures at high temperature. Sintering of metallic monolithic structures has been known as the biggest barrier to efficient and commercially viable solar thermochemical reactors. Even though these structures, which are formed from fine metallic particles (mainly ferrite based particles), are theoretically attractive as highly reactive materials due to their extremely large chemically active surface area, their utility is restricted due to the "sintering" phenomena. During sintering at high temperatures, the metallic particles get soft, melt, agglomerate, and diffuse into one another. The sintered structure is practically useless for chemical reaction due the loss of surface area.

Disclosed herein are non-sintering composite particles comprising particles of a first non-derivative of a first metal (hereinafter first non-metallic particle) that have dispersed in them particles of a second non-metallic derivative (hereinafter second non-metallic particle). The term "non-metallic derivative of a metal" as used herein implies a metal derivative that is non-metallic in nature. The non-metallic derivative is inorganic. The first non-metallic particles and the second non-metallic particles are metal oxides, metal carbides, metal nitrides, metal borides, metal silicides, metal oxycarbides, metal oxynitrides, metal boronitrides, metal carbonitrides, metal borocarbides, or the like, or a combination comprising at least one of the foregoing. In an exemplary embodiment, the first non-metallic particles and the second non-metallic particles are chemically different from each other. The first and the second non-metallic particles are immiscible in each other or are partially miscible in each other. In addition, when the first non-metallic particles and the second non-metallic particles are heated to an appropriate temperature, the first non-metallic particles are dispersed in the second non-metallic particles and the first non-metallic particles may be stabilized by a third non-metal that is a by-product and that is formed from at least one of the first and/or second non-metallic particles.

Disclosed herein too is a method of manufacturing a non-sintering composite or exploit sintering for use in a fluidized and/or stabilized bed reactor. The method involves uniformly mixing larger sized first non-metallic particles with smaller sized second non-metallic metal derivative to form a mixture. The mixture is then heated to an elevated temperature at which the first non-metallic particles are dispersed in the second non-metallic particles and may optionally be stabilized by a by-product of either the first and/or the second non-metallic particles that is formed at the elevated temperature. The sintered product is then ground-up into smaller particles that can be used in a bed of a reactor. The reactor can comprise a fluidized and/or stabilized bed of the non-sintering composite particles.

Prior to mixing, the first non-metallic particles are larger in size than the second non-metallic particles and preferably melt at lower temperatures than the second non-metallic particles. The first non-metallic particles can be oxides, carbides, nitrides, borides, silicides of metals such as iron, cobalt, manganese and/or copper. Exemplary first non-metallic particles comprise magnetite ($Fe_3O_4$).

The first non-metallic particles have a number average particle size that is at least 3 times greater, specifically at least 15 times greater, and more specifically at least 20 times greater than the number average particle size of the second non-metallic particles. The number average particle size is the radius of gyration of the particles and can be determined by small angle light scattering, scanning electron microscopy, or visible light microscopy.

It is desirable for the average particle size of the first non-metallic particles to be about 20 to about 80 micrometers, specifically about 30 to about 70 micrometers, and more specifically about 35 to about 65 micrometers. In an exemplary embodiment, when the first non-metallic particles comprise magnetite, the average particle size is about 25 to about 60 micrometers, specifically about 30 to about 55 micrometers, and more specifically about 40 to 50 micrometers. An exemplary particle size is 44 micrometers.

The first non-metallic particles are generally present in the mixture prior to sintering in amounts of about 2 to about 20 wt %, specifically about 3 to about 17 wt %, and more specifically about 4 to about 15 wt %, based on the total weight of the first non-metallic particles and the second non-metallic particles.

The secondary non-metallic particles are smaller in size than the first non-metallic particles and preferably melt at higher temperatures than the first non-metallic particles. The second non-metallic particles can be oxides, carbides, nitrides, borides, silicides of metals such as zirconium, titanium, aluminum, silicon and/or cerium. Exemplary second non-metallic particles comprise zirconia ($ZrO_2$).

It is desirable for the average particle size of the second non-metallic particles to be about 0.5 to about 10 micrometers, specifically about 1 to about 8 micrometers, and more specifically about 1.5 to about 6 micrometers. In an exemplary embodiment, when the second non-metallic particles comprise zirconia, the average particle size is about 0.5 to about 6 micrometers, specifically about 1.0 to about 4 micrometers, and more specifically about 1.5 to 3 micrometers. An exemplary particle size is 2 micrometers.

The second non-metallic particles are generally present in the mixture prior to sintering in amounts of about 80 to about 98 wt %, specifically about 83 to about 97 wt %, and more specifically about 85 to about 95 wt %, based on the total weight of the first non-metallic particles and the second non-metallic particles.

The weight ratio of the first non-metallic particles and the second non-metallic particles present in the mixture prior to sintering is about 1:4 to about 1:6, specifically about 1:4.2 to about 1:5, and more specifically about 1:4.3 to about 1:4.5. In one exemplary embodiment, when the first non-metallic particle is magnetite and the second non-metallic particle is zirconia, the weight ratio is 1:4.4.

The mixing of the first non-metallic particles and the second non-metallic particles takes place at room temperature and can be conducted in variety of mixing devices. The mixing is conducted for a time sufficient to obtain a uniform homogeneous mixture and to prevent the particles of one type from agglomerating together. Mixing can be conducted in devices that have a single screw, multiple screws, intermeshing co-rotating or counter rotating screws, non-intermeshing co-rotating or counter rotating screws, reciprocating screws, screws with pins, screws with screens, barrels with pins, rolls, rams, helical rotors, or combinations including at least one of the foregoing. An exemplary device for mixing the first non-metallic particles and the second non-metallic particles is a Henschel mixer and/or a Waring blender.

Since the second non-metallic particles are much smaller in size and are present in a much larger weight percent (as well as a much larger volume percent) they uniformly and homogeneously surround the larger first non-metallic particles when mixed. In other words, the second non-metallic particles are surrounded by the first non-metallic particles and therefore cannot contact each other.

The mixture of the first non-metallic particles and the second non-metallic particles is then disposed in a furnace for purposes of sintering it. The mixture may be placed directly in a furnace whose temperature is elevated to a desired value or alternatively, the mixture may be placed in a furnace at room temperature following which the temperature is raised to the desired value. The temperature is raised to a temperature that is proximate to the melting point of the lower temperature melting particle. For example, if the first non-metallic particle has a lower melting temperature than the second non-metallic particle, then the temperature of the mixture is raised to a temperature that is proximate to the melting temperature of the first non-metallic particle. The term "proximate" includes a range of ±150° C. around the melting point. The time period of heating will vary depending upon the mass of the mixture but can be for a period of about 5 minutes to about 5 hours.

When the first non-metallic particle is magnetite and the second non-metallic particle is zirconia, the mixture is heated to a temperature of 1450° C. The temperature of magnetite, which is the lower melting point material (of magnetite and zirconia) is 1538° C. The heating at the elevated temperature may result in the formation of a third non-metallic derivative which can coat the dispersed first non-metallic particles. In the case of the magnetite and zirconia, this third non-metallic derivative is Wüstite (FeO).

Heating the mixture results in the shrinking of the mixture as sintering between the particles occurs. During the sintering, the third non-metallic derivative may flow and form a neck between the first and second non-metallic particles.

The sintered materials are then cooled and crushed to form the composite particles which contain the second non-metallic particles dispersed in the first non-metallic particles. The particles may be sieved and separated based on size. These particles are reactive and can be used in a reactor to conduct or to facilitate a reaction. In one embodiment, the particles can be used in a solar reactor. In an exemplary embodiment, the average particle size (after crushing) for use in a solar reactor is about 200 to about 2000 micrometer, specifically about 650 to about 850 micrometers, and more specifically about 700 to about 800 micrometers. The particles have a density of about 1.5 grams per cubic centimeter to about 3 grams per centimeter.

The non-sintering composite particle has a large specific surface area which is greater than or equal to about 150 square meters per gram (m2/gram), specifically greater than or equal to about 200 square meters per gram, and more specifically greater than or equal to about 250 square meters per gram.

When used in a solar reactor, these particles produce larger amounts of product (hydrogen or carbon monoxide), when compared with other commercially available particles.

The composition and the method disclosed herein is exemplified by the following non-limiting example.

EXAMPLE

Example 1

This example was conducted to demonstrate how the composite particles comprising the first and second non-metallic particles are manufactured. The initial magnetite particles (the first non-metallic particles) having a characteristic diameter of less than 44 μm are obtained from AlfaAesar (Catalog number F.W.231.54). The characteristic diameter is 2 times the average particle size or 2 times the radius of gyration. The initial diameter of the zirconia particles (the second non-metallic particles) is about 2 μm with the specific surface area of greater than 5 m$^2$/gram. The second non-metallic particles are commercially available from Stanford Material Company (Catalogue number OX40-3N5E).

By homogeneously mixing the magnetite and zirconia powders in a drum with the $ZrO_2/Fe_3O_4$ mass ratio being about 4.4, a homogeneous gray mixture is attained. Since the resulting powder is very cohesive, the mixture needs to be carefully mixed in a drum for few minutes to achieve a homogeneous mixture. Then the sample is placed into the hot zone of a high temperature reactor. These large specific surface area and volume ratio of the zirconia is essential to ensure that the magnetite particles are completely embedded between zirconia particles and do not have a significant probability of contacting each other during the sintering. With a programmable temperature control and using a heating rate of 10° C./minute, the temperature of the magnetite/zirconia sample is raised to 1450° C. under a vacuum of $10^{-4}$ atmospheres. The magnetite releases a small amount of the oxygen and produces a magnetite-wüstite-zirconia mixture. At this point sintering is observed with the help of pressure sensors. Generally a large pressure drop across the bed is associated with the flow of gases passing through the porous material, however, as sintering occurs, the material start to shrink and provide a large gap between material and tube wall which causes much lower pressure drop.

A pressure sensor, which is installed for pressure drop measurements can identify the time at which sintering occurs. Wüstite (FeO) melts at 1377° C. (where magnetite melts at 1538° C.) so at this stage a small layer of molten wüstite is formed on the magnetite particles and this provides strong wüstite necks between zirconia and magnetite particles. After lowering the furnace temperature and re-oxidizing the sample at 1200° C., the temperature of the sample is raised to 1590° C., which is higher than the melting temperature of the magnetite. At this point, all the possible phases of metal particles will be in the molten phase. The large volume of the non-molten zirconia particles keeps the molten metals apart from each other. This is because the surface tension of the molten phase of metals are so high (about 1.80 N·m$^{-1}$) that the surface tension force of the molten metal retains the molten particles in a spherical shape and limits the pull of gravity so that the molten metal does not flow downward, rather it sticks to the interstitial zirconia particles. This method facilitates the manufacturing of a homogeneous sintered block without noticeable segregation. After such a thermochemical heat treatment processes, the sintered block is removed from the reactor and is mechanically crushed. The large content of zirconia particles, make the sintered sample easy to crush. A careful crushing is conducted to prevent making very fine particles which are not stable at high temperatures.

After the crushing, the particles are passed through a sieve with the opening size of 750 μm. Sieving can be used to capture the particles in the favorable size range. Therefore, within each crushed particle, there are thousands and thousands of the original fine zirconia particles that are already heat treated and completely sintered and do not have a means to further sinter. The crushed sample is therefore in the form of powder and contains 750 μm (average size) particles with the apparent density of 2 grams per cubic centimeter (g/cc). These large synthesized particles are extremely reactive and stable at the normal operating temperature of the reduction step (1450° C. under $10^{-4}$ atmosphere vacuum). The fuel production rate coming out of this novel sample is exceptional and significantly higher than those reported in the open literature.

Example 2

Figure 2:
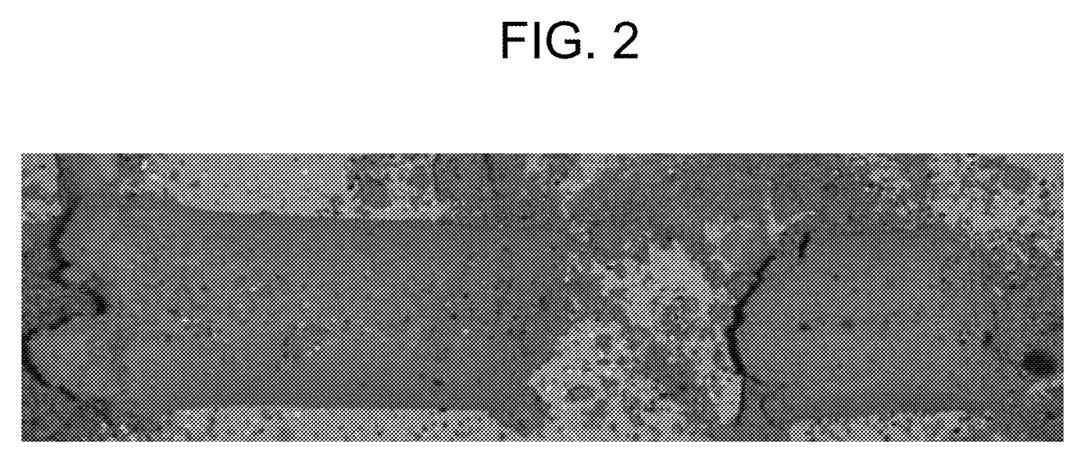
FIG. 2 is a photograph showing the homogeneous sintered block after the heat treatment.
Figure 3:
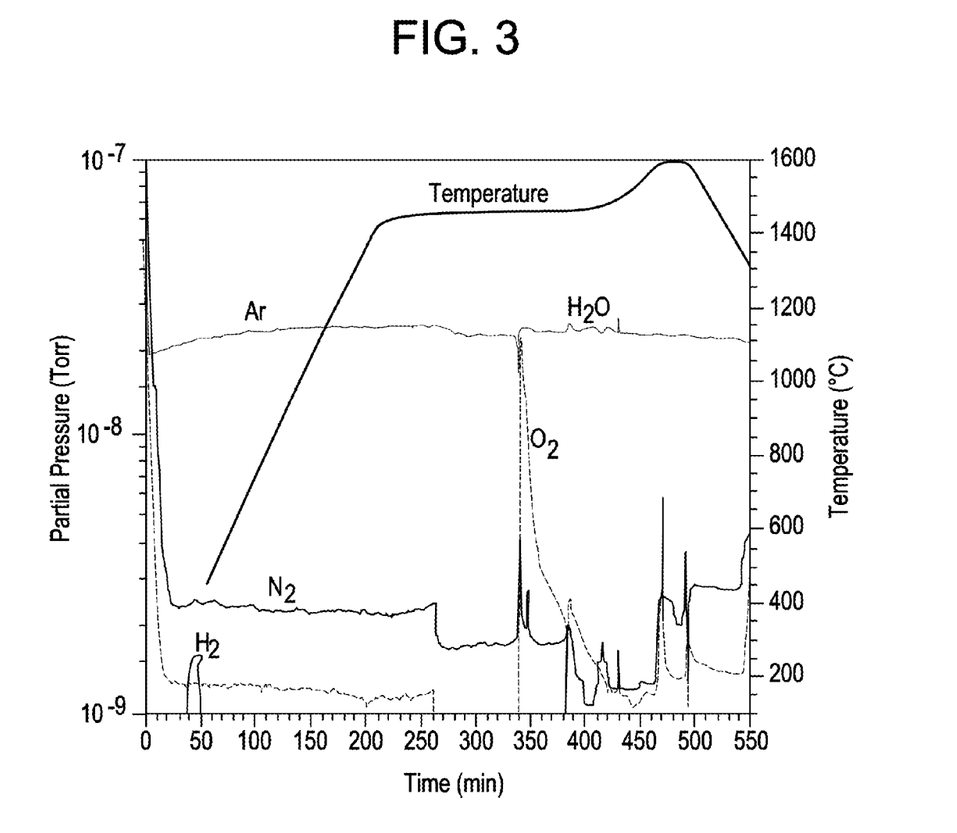
FIG. 3 is a graph showing oxygen evolution during the highest temperature heat treatment at 1590° C.

This example was conducted to demonstrate the reactivity of the particles in a reduction-oxidation reaction. The composite particles are placed in the middle of a chemical reactor and cycled back and forth between thermal reduction and oxidation steps (redox reaction). The first, $2^{nd}$, $3^{rd}$ $4^{th}$ and $5^{th}$ reduction steps were performed at temperatures of 1450, 1590, 1450, 1450, 1450° C., respectively. FIG. 2 is a photograph showing the homogeneous sintered block after the heat treatment (i.e., after the five cycles mentioned above). In addition, the hydrogen and oxygen evolution during these cycles is shown in the FIG. 3. FIG. 3 is a graph showing oxygen evolution during the highest temperature heat treatment at 1590° C., while the FIG. 4 is a graph showing hydrogen and oxygen evolution during the 3 oxidation steps at 1200° C. and 3 reduction steps conducted at 1450° C. during the redox cycle.

Figure 4:
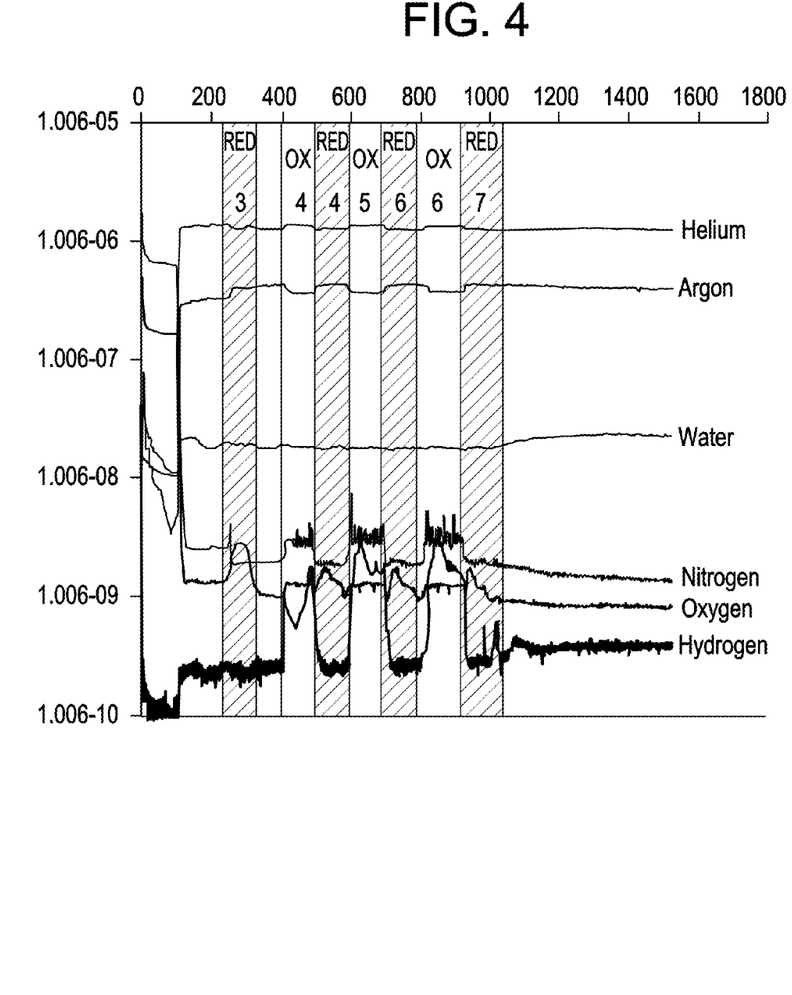
FIG. 4 is a graph showing hydrogen and oxygen evolution during the 3 oxidation steps at 1200° C. and 3 reduction steps conducted at 1450° C. during the heat treatment.

FIG. 4 clearly shows that the sintered sample can easily release oxygen at temperatures of 1430-1450° C. for a few minutes since the pores are not blocked. As soon as the oxygen is released, the wüstite layer with its low melting temperature forms and this gradually clogs all the pores in the sample in few minutes. FIG. 4 shows that after sintering, any redox cycles will be very low in productivity. At this point the sintered sample shown in FIG. 2 will be taken out of the reactor and will be carefully crushed at room temperature. The sample is therefore sintered for only a short period of time till the third non-metallic derivative is formed, after which it is immediately stopped and the material is cooled and crushed for use in a reactor.

Figure 5:
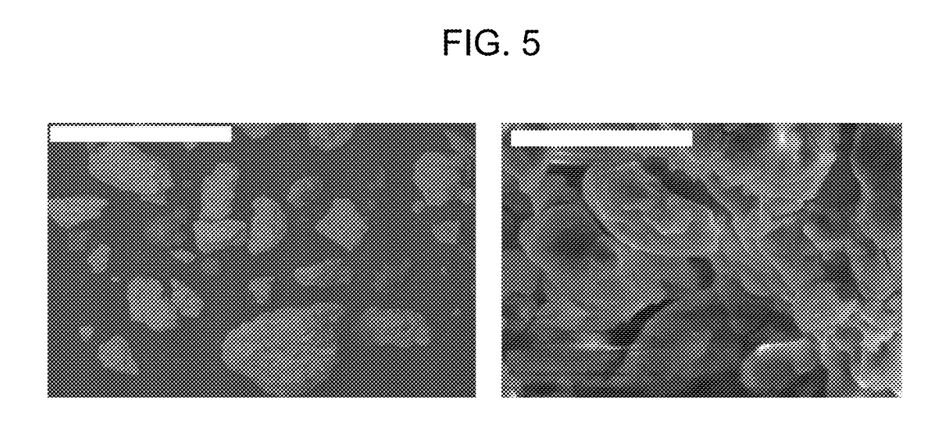
FIG. 5 shows a photomicrographic image of the crushed sample after 11 redox cycles.

FIG. 5 shows a photomicrographic image of the crushed sample after 11 redox cycles. Particles sizes are in a millimeter scale while each individual particle contains micron sized finer zirconia and magnetite particles. The hydrogen and oxygen evolution of this novel sample during 4 consecutive redox steps cycling between 1200 and 1450° C. is shown in FIG. 6.

Figure 6:
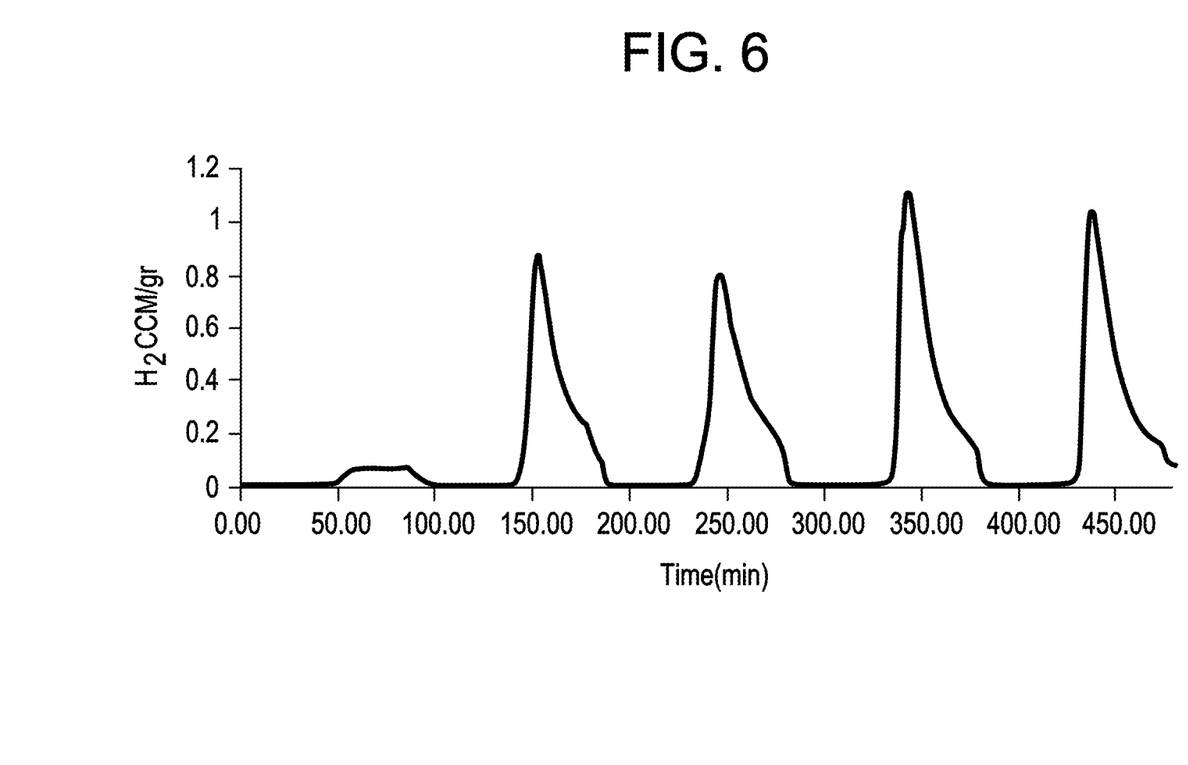
FIG. 6 shows the hydrogen production rate of the particulates from the crushed sintered block during redox cycles of 14, 15, 16 and 17.
Figure 7:
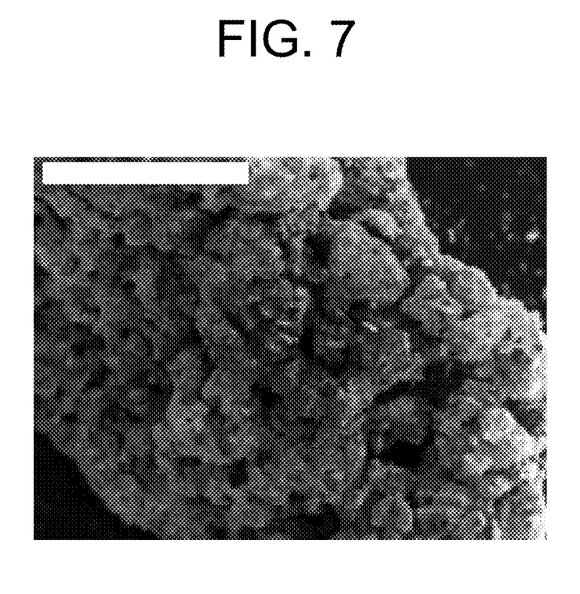
FIG. 7 is a photomicrographic image of the novel composite particles after the stabilized materials.

The FIG. 6 is a graph showing hydrogen production rate of the novel material during redox cycles of 14, 15, 16 and 17. FIG. 7 is a photomicrographic image of the novel composite particles after the stabilized materials.

From the FIG. 6 it may be seen that even after redox runs are carried out at temperatures that are almost close to the melting point of the magnetite, there is no loss of structure (i.e., surface area) that would result in a loss of hydrogen production capacity. The hydrogen production remains relatively constant during the redox cycles, despite the use of elevated temperatures for hydrogen production. The cycles 14-17 show no significant change in hydrogen production. The process is therefore very robust and reproducible as a result of the stability of the non-sintering composite.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the invention not be limited to the particular embodiment disclosed as the best mode contemplated for carrying out this disclosure.

What is claimed is:

1. A composite particle comprising:
a first non-metallic particle in which is dispersed a second non-metallic particle, where the first non-metallic particle and the second non-metallic particle are inorganic; and where a chemical composition of the first non-metallic particle is different from a chemical composition of the second non-metallic particle; and where the first non-metallic particle and the second non-metallic particle are metal oxides, metal carbides, metal nitrides, metal borides, metal silicides, metal oxycarbides, metal oxynitrides, metal boronitrides, metal carbonitrides, metal borocarbides, or a combination thereof; where the first non-metallic particle has an average particle size of about 20 to about 80 micrometers, and where the second non-metallic particle has an average particle size of about 0.5 to about 10 micrometers prior to a sintering.

2. The composite particle of claim 1, further comprising a third non-metallic derivative that is formed from the first non-metallic particle and the second non-metallic particle during a sintering process that comprises sintering the first non-metallic particle and the second non-metallic particle to a temperature that is within ±150° C. of a melting point of the lower melting particle of the first non-metallic particle and the second non-metallic particle.

3. The composite particle of claim 1, where the composite particle has an average particle size of about 200 to about 2000 micrometers.

4. The composite particle of claim 1, where a weight ratio of the first non-metallic particle to the second non-metallic particle is about 1:4 to about 1:6.

5. The composite particle of claim 1, where the first non-metallic particle comprises magnetite.

6. The composite particle of claim 1, where the second non-metallic particle comprises zirconia.

7. The composite particle of claim 1, having a surface area of greater than or equal to about 100 square meter per gram.

8. A method comprising:
mixing a first non-metallic particle with a second non-metallic particle to produce a homogeneous mixture;
sintering the homogenous mixture to a temperature that is within ±150° C. of a melting point of a lower melting particle selected from the first non-metallic particle and the second non-metallic particle; where the sintering produces a sintered composite; and
crushing the sintered composite to form particulates.

9. The method of claim 8, further comprising sieving the particulates.

10. The method of claim 9, further comprising disposing the particulates in a reactor.

11. The method of claim 10, where the reactor is a solar reactor.

12. The method of claim 9, where a redox reaction is conducted in the reactor.

* * * * *

UNITED STATES PATENT AND TRADEMARK OFFICE
CERTIFICATE OF CORRECTION

PATENT NO. : 9,776,154 B2
APPLICATION NO. : 14/653427
DATED : October 3, 2017
INVENTOR(S) : James F. Klausner et al.

Page 1 of 1

It is certified that error appears in the above-identified patent and that said Letters Patent is hereby corrected as shown below:

On the Title Page

In the title, please delete:
"NOVEL MATERIAL COMPRISING TWO DIFFERENT NON-METALLIC PARRTICLES HAVING DIFFERENT PARTICLE SIZES FOR USE IN SOLAR REACTOR"
And replace with:
--NOVEL MATERIAL COMPRISING TWO DIFFERENT NON-METALLIC PARTICLES HAVING DIFFERENT PARTICLE SIZES FOR USE IN SOLAR REACTOR--

Signed and Sealed this
Fourth Day of September, 2018

Andrei Iancu
*Director of the United States Patent and Trademark Office*